United States Patent

Münch et al.

[11] Patent Number: 6,159,024
[45] Date of Patent: Dec. 12, 2000

[54] DEVICE FOR CREATING AN ELECTRICALLY CONDUCTING CONNECTION FOR AN ASSEMBLY PANEL FITTED IN A SWITCH CABINET

[75] Inventors: Udo Münch, Sinn; Wolfgang Reuter, Burbach, both of Germany

[73] Assignee: Rittal-Werk Rudolf Loh GmbH & Co. KG, Herborn, Germany

[21] Appl. No.: 09/101,703

[22] PCT Filed: Dec. 20, 1996

[86] PCT No.: PCT/EP96/05797

§ 371 Date: Jul. 15, 1998

§ 102(e) Date: Jul. 15, 1998

[87] PCT Pub. No.: WO97/26690

PCT Pub. Date: Jul. 24, 1997

[30] Foreign Application Priority Data

Jan. 17, 1996 [DE] Germany .......................... 196 01 458

[51] Int. Cl.⁷ .......................... H01R 4/66; H01R 13/648
[52] U.S. Cl. .................. 439/92; 439/95; 174/51
[58] Field of Search .......................... 439/92, 95; 174/51, 174/52.1

[56] References Cited

U.S. PATENT DOCUMENTS 4,558,917  12/1985  Kamono et al. .......................... 439/95
4,803,306   2/1989  Malmquist .
5,233,507   8/1993  Günther et al. .
5,343,361   8/1994  Rudy, Jr. et al. .......................... 174/51
5,853,296  12/1998  Gunther et al. .......................... 439/92

FOREIGN PATENT DOCUMENTS

| 0 634 550  | 1/1995 | European Pat. Off. . |
| 87 12 020  | 1/1988 | Germany . |
| 38 35 535  | 6/1989 | Germany . |
| 41 01 427  | 7/1991 | Germany . |
| 41 10 800  | 7/1992 | Germany . |
| 41 40 072  | 9/1993 | Germany . |
| 43 11 246  | 3/1994 | Germany . |
| 94 14 036  | 2/1995 | Germany . |
| 195 40 300 | 8/1996 | Germany . |

*Primary Examiner*—Paula Bradley
*Assistant Examiner*—Katrina Davis
*Attorney, Agent, or Firm*—Pauley Petersen Kinne & Fejer

[57] ABSTRACT

A device for creating an electrically conducting connection for an assembly panel fitted parallel to the rear side in a switch cabinet, to which assembly panel are allocated on at least one side a frame section of a frame, an assembly track or a frame section-type edge of a side wall. Specially designed contact springs and assembly panels ensure that the assembly panel, optionally fitted with a non-conducting surface protection layer, can be fitted simply and with appropriate contacts in a switch cabinet.

10 Claims, 3 Drawing Sheets

DEVICE FOR CREATING AN ELECTRICALLY CONDUCTING CONNECTION FOR AN ASSEMBLY PANEL FITTED IN A SWITCH CABINET

BACKGROUND OF THE INVENTION

1. Field of the Invention

This invention relates to a device for an electrically conductive connection of a mounting plate installed in a switchgear cabinet, rack or housing.

2. Description of Prior Art

If a mounting plate is connected in an electrically conducting manner with the rack or the cabinet body, it is necessary to create connecting points on the mounting plate and the rack or the cabinet body, which are connected with each other by grounding cables. It is thus necessary, particularly with respect to the mounting plate, to make the appropriate preparations, and contacting can only be performed after the mounting plate is inserted. This is not easy to do, in particular when the mounting plate is installed in the switchgear cabinet directly connected to the back wall.

SUMMARY OF THE INVENTION

It is one object of this invention to create a device of the type mentioned at the outset, wherein contacting with the rack or the cabinet body of the switchgear cabinet can automatically take place when the mounting plate is inserted, and wherein the application of the contact spring is simple and solid.

With the aid of the simple and cheaply produced contact springs, which can be fixed on the edge of the mounting plate prior to the latter being inserted, it is possible while inserting the mounting plate to automatically provide electrically conducting connections with the adjoining frame legs of the rack, mounting rails or bevel of the lateral walls at an arbitrary number of locations, since the contact section of the contact springs rest against them under prestress and produce electrically conducting connections with these elements of the switchgear cabinet, which are provided with an electrically conducting surface, if required. In this case it is unimportant whether the mounting plate has an electrically conducting surface or an electrically non-conducting protective surface coating. When the contact spring is slipped on the end section of the edge of the mounting plate, the securing claws penetrate through the protective surface coating and provide prestressed electrical connections with the mounting plate. Thus, the edge of the mounting plate is beveled in a U-shape in such a way that the end section extends parallel with the rear wall and faces it, and the contact sections partially enclose the edge of the mounting plate. An improved support of the contact spring on the end section of the edge of the mounting plate is thus achieved. Furthermore, when inserting the mounting plate over the contact sections, no force component is exerted which might lead to the release of the contact spring from the edge of the mounting plate. Alternatively, the contact springs are fixed in place on the frame leg, the mounting rail or the frame leg-like bevel and penetrate through a protective surface coating and make contact with the edge area of the mounting plate which, if required, is also bare, without requiring additional manipulations.

With one preferred embodiment of this invention, along with a dependable operation, the embodiment and attachment of the contact springs on the frame legs, the mounting rail or the frame leg-like bevel is simple, and there is solid support. Alternatively, the contact springs are fixed in place on the frame leg, the mounting rail or the frame leg-like bevel and penetrate through a protective surface coating and make contact with the edge area of the mounting plate which, if required, is also bare, without requiring additional manipulations.

In accordance with one embodiment of this invention the securing claws and the inward located securing section are laterally stamped out and bent in a direction toward the outward located securing section.

If the contact sections are wider than the securing sections, and the securing claws are oriented in the direction toward the end of the end section of the edge of the mounting plate, the contact spring can be produced from a strip of spring band steel as a simple punched bent component.

In another embodiment the contact sections of the contact spring rest on the outside against the rounded transitions of the center section of the edge of the mounting plate. The contact sections thus also improve the support of the contact spring on the edge of the mounting plate.

If necessary, a connection possibility for a grounding cable can be easily provided because the contact section of the contact spring facing away from the rear wall is extended as the connecting section, which has a connecting bore and/or terminates in slip-on contacts, and is beveled in the direction toward the contact edge as well. The frame leg of the rack, the mounting rail or the bevel of the lateral wall can also have a protective surface coating.

BRIEF DESCRIPTION OF DRAWINGS

This invention will be explained in more detail in view of an exemplary embodiment represented in the drawings wherein.

DESCRIPTION OF PREFERRED EMBODIMENTS

Figure 1:
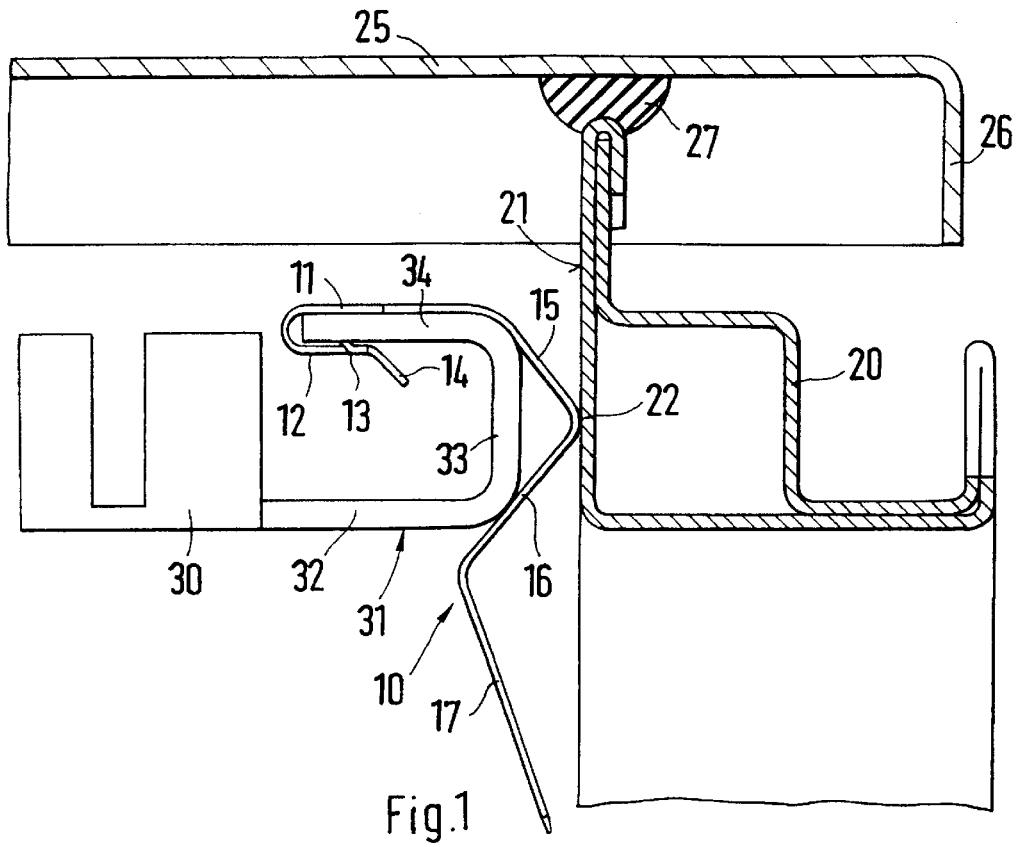
FIG. 1 is a partial section view of an electrically conducting connection made by a contact spring in accordance with this invention between a mounting plate, installed in the area of the rear frame of the rack of a switchgear cabinet with a protective surface coating, and the rack.

As shown in FIG. 1, frame legs 20 form a frame in an area of a back of the switchgear cabinet, wherein a profile side of the frame legs 20, which is extended into a sealing strip, forms an installation wall. The rear wall 25, which has a beveled edge 26, supports a sealing element 27 on its inside, which rests against the sealing strip and allows a tight connection between the rear wall 25 and the frame leg 20. In place of the frame leg 20, a frame leg-like bevel of the associated rear wall can also form the installation wall 21. Furthermore, if the mounting plate 30 is installed offset from the rear wall, a mounting rail can also form the installation wall 21. Contact places, such as shown in FIG. 1, can be formed on all four sides of the mounting plate 30. This is only a function of the embodiment of the edge of the mounting plate 30 and the assignment of installation walls 21 for the contact spring 10. Preferably both vertical sides of the mounting plate 30 have an edge 3 1 beveled in a U-shape. In this case the lateral section 32 and the end section 34 are rounded and make a transition into the center section 33, which closes off the edge 31 toward the exterior. The end section 34 extends parallel with and faces the rear wall 25.

Figures 2, 3:
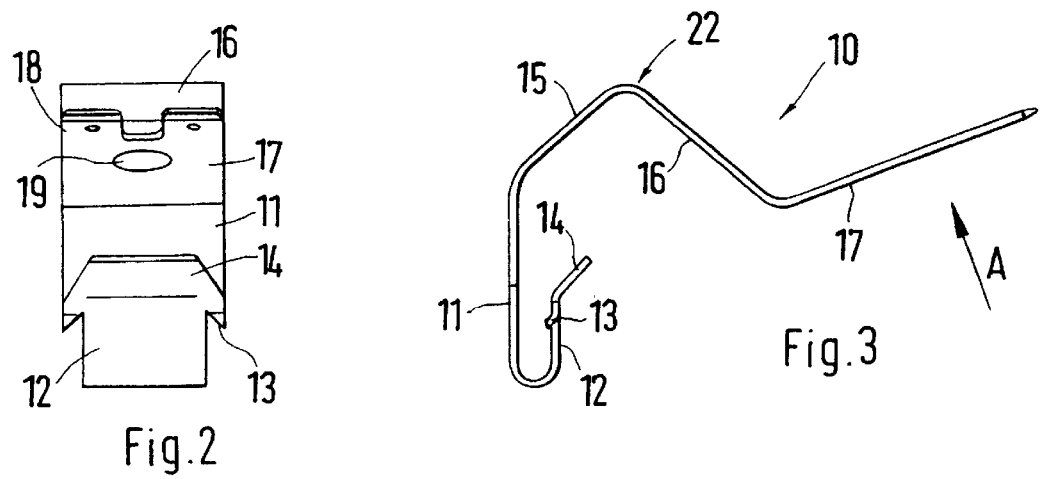
FIGS. 2 and 3 are front and side views, respectively, of a contact spring wherein the two views are offset by 90°.

Together with the securing sections 11 and 12, the contact spring 10, which is shown beveled in FIGS. 1 and 3, forms a plug receptacle which is slipped on the end of the end section 34. The end section 14 of the securing section 12 is bent away from the securing section 11, so that sliding the contact spring 10 on the end section 34 of the edge 31 of the mounting plate 30 is simplified, and prestressing between the securing sections 11 and 12 is made easier by deflecting them. Securing claws 13 are stamped laterally from the securing section 12 and are bent in the direction of the securing section 11. The securing claws 13 are oriented in the direction toward the end of the end section 34 for improving the support of the slipped-on contact spring 10. The outer securing section 11 makes a transition into the two contact sections 15 and 16, which enclose the edge 31 of the mounting plate 30 and rest against the rounded transitions to the center section 33 of the edge 31. The two contact sections 15 and 16 form a contact edge 22, which rests with prestress against the installation wall 21. At the same time the contact sections 15 and 16 rest with prestress on the edge 31 of the mounting plate 30 and improve the support of the contact spring 10 on the contact plate 10.

While inserting the mounting plate 30, the contact sections 15 and 16 of the contact spring 30 are pushed in the direction toward the center section 33 of the edge 31. Because of this, prestress is generated for the contact edge 22. The contact section 16 makes a small sliding movement on the edge 31, without closing the support on the edge 31 and without removing the prestress between the two contact sections 15 and 16.

As shown in FIG. 2, at least the securing section 12 is narrower than the remaining sections of the contact spring, so that the contact spring 10 with the securing claws 13 on the securing section 12 can be made as a punched bent component from a uniformly wide strip of spring band steel.

Figure 4:
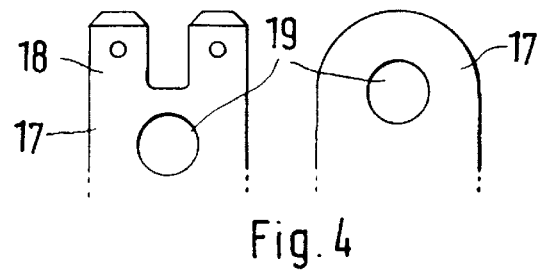
FIG. 4 shows two different embodiments of an end of the connecting section of the contact spring.

If the installation wall 21 has an electrically non- conducting protective surface coating, the contact section 16 is extended as connecting section 17 and is beveled in the direction toward the installation wall 21. As shown in FIG. 4, the end of the connecting section 17 can have a connecting bore 18, which makes the connection of a grounding cable easier. In addition, the end can also terminate in plug connectors, which can be embodied as a slip-on contact 18. It is thus possible to provide an electrically conducting connection of the mounting plate 30 with the remaining switchgear cabinet installation.

Figure 5:
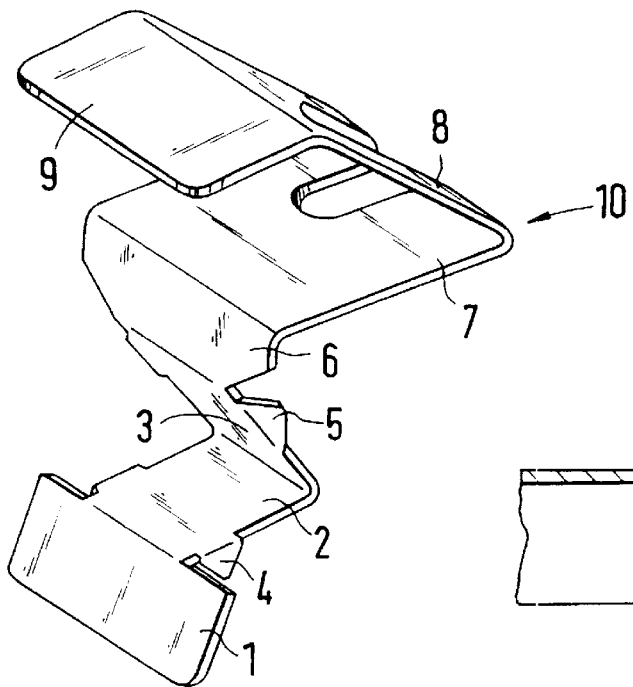
FIG. 5 is a perspective view of a contact spring in accordance with another preferred embodiment of this invention.
Figure 6:
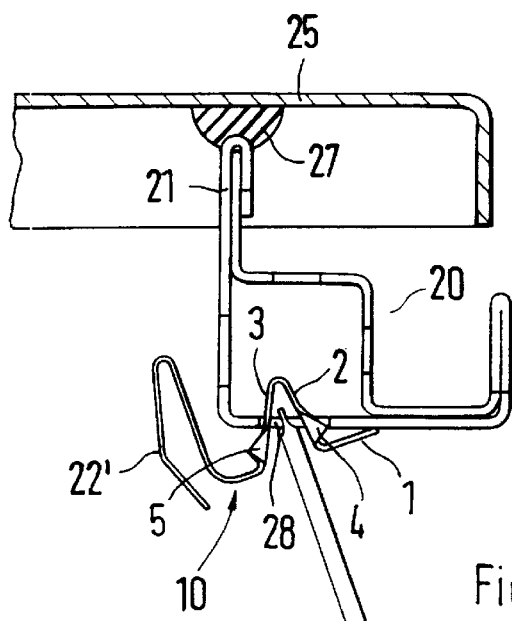
FIGS. 6, 7 and 8 show different examples of an installation of the contact spring as shown in FIG. 5.
Figure 6:
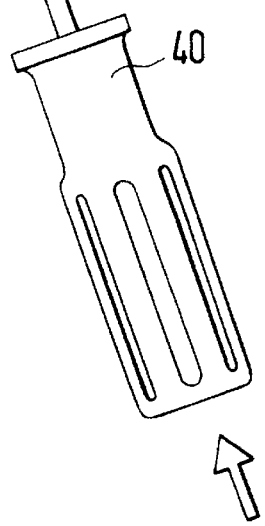
Figure 7:
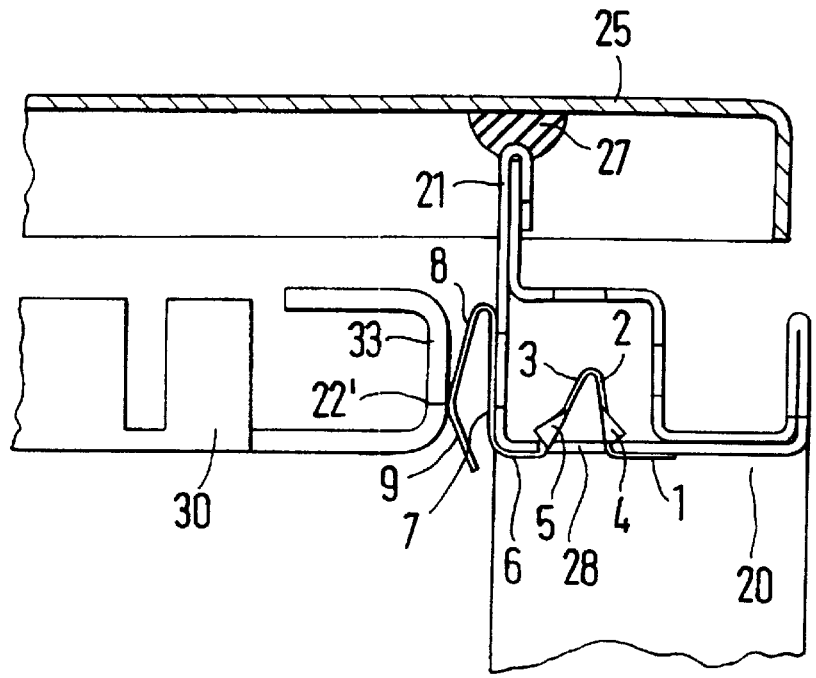
Figure 8:
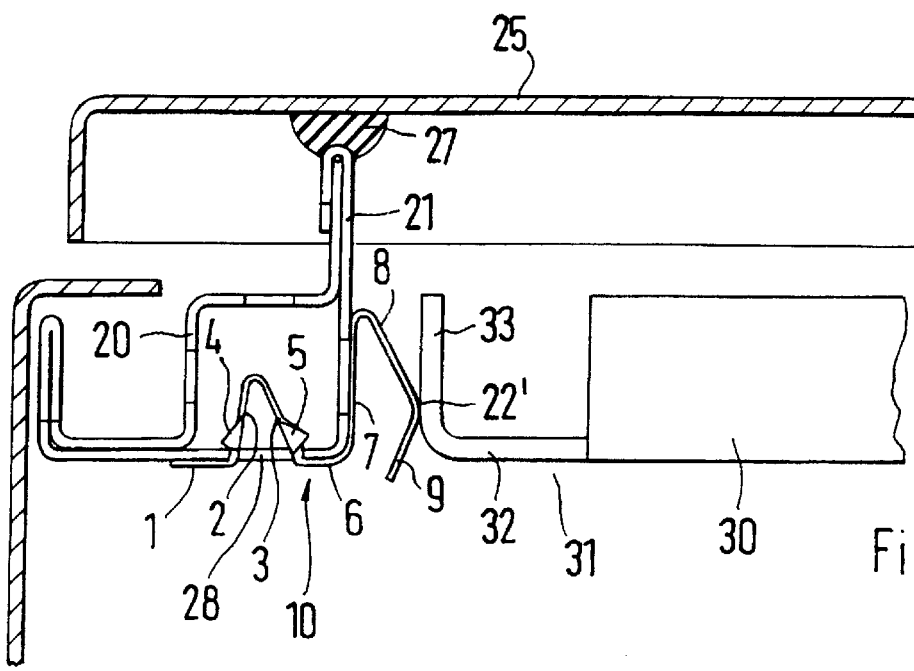

FIGS. 5 to 8 represent an alternative embodiment of the contact spring 10. A perspective representation of the contact spring 10 is shown in FIG. 5. FIG. 6 shows one manner of proceeding when attaching the contact spring 10 on an opening 28 of the frame leg 20 by means of a simple tool 40, while FIGS. 7 and 8 represent the contact spring 10 in the installed state on a right, or respectively left frame leg.

The contact spring 10 in accordance with FIGS. 5 to 8 is essentially bent in an F-shape with a securing leg 2 and another securing leg 3, and is inserted under a defined tension into the opening 28, wherein the dimensions of the opening 28 are matched to the open side of the V, and the securing claws 4 and 5 fix the contact spring 10 in place on the inside of the wall around the opening. The securing claws 4 and 5 can also scratch a possible protective surface coating open during insertion with the tool 40 and to form a contact with the metal.

The opening 28 is located in a leg of the frame leg 20 directed toward the switchgear cabinet interior and extends parallel with the plane of the mounting plate 30. An end section 1, oriented toward the adjoining lateral wall of the switchgear cabinet, is connected to the one securing leg 2 of the contact spring 10, which rests flat against the frame leg 20, while the other securing leg 3 of the contact spring, located away from the lateral wall, makes a transition into a contact section 6, which also rests flat against the frame leg 20 and which continues in a further contact section 7 oriented at right angles with it toward the rear wall 25. The contact section 7 also rests flat on the exterior of the frame leg 20 against the profile leg, which is oriented toward the switchgear cabinet interior and extends vertically with respect to the rear wall 25. On the side facing the rear wall 25, an extension of the further contact section 7 is then bent essentially back upon itself and into a V-shape or U-shape, wherein the sections located opposite the further contact section 7 form contact sections 8 and 9. Together, the contact sections 8 and 9 form a contact edge 22' which rests under spring tension against the edge 33 of the mounting plate 30 in the installed state of the latter.

The contact section 9 at the end, which is bent obliquely in the direction toward the further contact section 7, here results in a resilient insertion slope for the mounting plate 30 to be inserted, so that a dependable operation is assured.

If the edge of the mounting plate 30 has a protective surface coating, it is possible to also provide claw- like protrusions in the area of the contact edge 22', by means of which the protective surface coating is scratched away.

What is claimed is:

1. In a device for an electrically conductive connection of a mounting plate (30) installed in a switchgear housing, to which one of a frame leg (20), a mounting rail and a frame leg-like bevel of a lateral wall is assigned on at least one side, wherein the mounting plate (30) is one of beveled at a facing edge (31) and having a reinforcement, wherein at least one multiple beveled contact spring (10) is used for contacting between the mounting plate and the switchgear housing, the spring being attached on one of an end section (34) of the edge (31) and on the reinforcement of the mounting plate (30) by U-shaped securing sections (11, 12) having securing claws (13), producing an electrical connection, supported by a prestressing and secured on the mounting plate (30), and wherein two contact sections (15, 16) of the spring adjoin the outward located securing section (11) of the contact spring (10), which form a contact edge (22) which is supported on the frame leg (20) of the mounting rail or the bevel with prestress, and wherein one of the frame leg (20) of one of the mounting rail and the bevel has an electrically conducting surface, or in an area of the contact edge (22) the contact spring (10) has claws which are oriented toward the frame leg (20) of one of the mounting rail and the bevel, or both;

the improvement comprising:

the edge (31) of the mounting plate (30) beveled in a U-shape to have legs composed of a lateral section and an end section and a bight composed of a center section so that the end section (34) extends parallel with and faces the rear wall (25), (b) the contact spring (10) slipped over and around the end section (34) with the U-shaped securing sections (11, 12) contacting the end section (34), and (c) the contact sections (15, 16) partially enclosing the edge of the mounting plate (30).

2. In the device in accordance with claim 1, wherein the contact sections (15, 16) are wider than the securing sections (1 1, 12), and the securing claws (13) are directed in a direction of the end section (34) of the edge (31) of the mounting plate (30).

3. In the device in accordance with claim 1, wherein the contact sections (15, 16) of the contact spring (10) rest on an outside of the rounded transitions of a center section (33) of the edge (31) of the mounting plate (30).

4. In the device in accordance with claim 1, wherein the contact section (16) of the contact spring (10) facing away from the rear wall (25) is extended as a connecting section (17), which at least one of has a connecting bore (19) and terminates in slip-on contacts (18), and is also beveled in a direction toward the contact edge (22).

5. In the device in accordance with claim 1, wherein the securing claws (13) are laterally stamped out of the inward located securing section (12) and are bent in a direction toward the outward located securing section (11).

6. In the device in accordance with claim 5, wherein the contact sections (15, 16) are wider than the securing sections (11, 12), and the securing claws (13) are directed in a direction of the end section (34) of the edge (31) of the mounting plate (30).

7. In the device in accordance with claim 6, wherein the contact sections (15, 16) of the contact spring (10) rest on an outside of the transitions between the legs and the bight of the edge (31) of the mounting plate (30).

8. In the device in accordance with claim 7, wherein the contact section (16) of the contact spring (10) facing away from the rear wall (25) is extended as a connecting section (17), which at least one of has a connecting bore (19) and terminates in slip-on contacts (18), and is also beveled in a direction toward the contact edge (22).

9. In a device for an electrically conductive connection of a mounting plate installed in a switchgear housing, to which one of a frame leg (20), a mounting rail and a bevel in a manner of a frame leg of a lateral wall is assigned on at least one side, wherein at least one multiple beveled contact spring (10) is used for contacting an edge (33) of the mounting plate (30), which is fixed in place in a contacting manner at one end at one of a fastening point (28) of a section of the frame leg (20), the mounting rail and the frame leg-like bevel which is parallel with a plane of the mounting plate (30), and on the other end is resiliently and contactingly supported on the edge (33) of the installed mounting plate (30), and wherein the contact spring (10) has claws (4, 5) for contacting in one of an area of the fastening point (28) and the support point of the mounting plate (30), wherein a contact section (1, 6), which follows the fastening point (28) rests against the parallel section, and a further contact section (7) following the one contact section (6), which is vertical with respect to the one contact section (6)

and faces the edge (33) of the mounting plate (30), rests against one of a section of the frame leg (20), the mounting rail and the frame leg-like bevel, and wherein another contact section (8, 9) forms a U-shaped or a V-shaped contact edge (22') between themselves, the improvement comprising:

the further contact section (7) extends along and is supported by the one of the frame leg, mounting rail and frame leg-like bevel; and is then bent back upon itself 180° to form the another contact section (8, 9) in one of a U-shape and V-shape apart from and in opposition to the further contact section (7), and the another contact section in one of a U-shape or V-shape lies between the section of the frame leg, the mounting rail and the frame-leg like bevel and the section of the mounting plate which are parallel and contacts one of the parallel sections.

10. In the device in accordance with claim 9, wherein a fastening point of one of the frame leg (20), the mounting rail and the frame leg-like bevel forms an opening (28) with one of a U-shaped and a V-shaped bevel matched to the latter, and the claws (4, 5) extend behind the wall in an inserted state.

\* \* \* \* \*